(12) United States Patent  
Mack et al.

(10) Patent No.: US 7,696,495 B2
(45) Date of Patent: Apr. 13, 2010

(54) METHOD AND DEVICE FOR ADJUSTING A BEAM PROPERTY IN A GAS CLUSTER ION BEAM SYSTEM

(75) Inventors: Michael E. Mack, Manchester, MA (US); Yan Shao, Andover, MA (US)

(73) Assignee: TEL Epion Inc., Billerica, MA (US)

( * ) Notice: Subject to any disclaimer, the term of this patent is extended or adjusted under 35 U.S.C. 154(b) by 385 days.

(21) Appl. No.: 11/864,302

(22) Filed: Sep. 28, 2007

(65) Prior Publication Data

US 2009/0084977 A1 Apr. 2, 2009

(51) Int. Cl.
*H01J 37/317* (2006.01)
*H01J 37/08* (2006.01)

(52) U.S. Cl. ............................. 250/492.21; 250/423 R; 250/424; 438/515

(58) Field of Classification Search ..................... None
See application file for complete search history.

(56) References Cited

U.S. PATENT DOCUMENTS 3,801,788 A * 4/1974 Milne .......................... 250/282
5,767,511 A * 6/1998 Macler ......................... 250/281
7,067,828 B2 * 6/2006 Swenson ................... 250/492.21
2007/0010095 A1 * 1/2007 Takaoka ........................ 438/689

* cited by examiner

*Primary Examiner*—Jack I Berman
(74) *Attorney, Agent, or Firm*—Wood, Herron & Evans, LLP

(57) ABSTRACT

A method and device for adjusting a beam property, such as a beam size, a beam shape or a beam divergence angle, in a gas cluster beam prior to ionization of the gas cluster beam is described. A gas cluster ion beam (GCIB) source is provided, comprising a nozzle assembly having a gas source, a stagnation chamber and a nozzle that is configured to introduce under high pressure one or more gases through the nozzle to a vacuum vessel in order to produce a gas cluster beam. Additionally, the GCIB source comprises a gas skimmer positioned downstream from the nozzle assembly that is configured to reduce the number of energetic, smaller particles in the gas cluster beam. Furthermore, the GCIB source comprises a beam adjustment device positioned downstream from the gas skimmer that is configured to adjust at least one beam property of the gas cluster beam, and an ionizer positioned downstream from the beam adjustment device that is configured to ionize the gas cluster beam to produce a GCIB.

20 Claims, 5 Drawing Sheets

METHOD AND DEVICE FOR ADJUSTING A BEAM PROPERTY IN A GAS CLUSTER ION BEAM SYSTEM

BACKGROUND OF THE INVENTION

1. Field of Invention

The invention relates to a method and system for treating a substrate using a gas cluster ion beam (GCIB), and more particularly to a method and device for adjusting a beam property, such as a beam size, a beam shape or a beam divergence angle, of a gas cluster beam prior to ionizing the gas cluster beam.

2. Description of Related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules). Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases.

Several emerging applications for GCIB processing of substrates on an industrial scale are in the semiconductor field. Although GCIB processing of a substrate is performed using a wide variety of gas-cluster source gases, many of which are inert gases, many semiconductor processing applications use reactive source gases, sometimes in combination or mixture with inert or noble gases, to form the GCIB.

SUMMARY OF THE INVENTION

The invention relates to a method and device for treating a substrate using a gas cluster ion beam (GCIB). Furthermore, a method and device is provided for adjusting a beam property of a gas cluster beam prior to ionizing the gas cluster beam.

According to one embodiment, a method and device for adjusting a beam property, such as a beam size, a beam shape or a beam divergence angle, in a gas cluster beam prior to ionization of the gas cluster beam is described. A gas cluster ion beam (GCIB) source is provided, comprising a nozzle assembly having a gas source, a stagnation chamber and a nozzle that is configured to introduce under high pressure one or more gases through the nozzle to a vacuum vessel in order to produce a gas cluster beam. Additionally, the GCIB source comprises a gas skimmer positioned downstream from the nozzle assembly that is configured to reduce the number of energetic, smaller particles in the gas cluster beam. Furthermore, the GCIB source comprises a beam adjustment device positioned downstream from the gas skimmer that is configured to adjust at least one beam property of the gas cluster beam, and an ionizer positioned downstream from the beam adjustment device that is configured to ionize the gas cluster beam to produce a GCIB.

According to another embodiment, a GCIB processing system configured to treat a workpiece is described. The GCIB processing system comprises a vacuum vessel, a gas cluster ion beam (GCIB) source disposed in the vacuum vessel and configured to produce a GCIB, and a workpiece holder configured to support the workpiece inside the vacuum vessel for treatment by the GCIB. The GCIB source comprises a nozzle assembly comprising a gas source, a stagnation chamber and a nozzle, and configured to introduce under high pressure one or more gases through the nozzle to the vacuum vessel in order to produce a gas cluster beam, a gas skimmer positioned downstream from the nozzle assembly, and configured to reduce the number of energetic, smaller particles in the gas cluster beam, a beam adjustment device positioned downstream from the gas skimmer, and configured to adjust at least one beam property of the gas cluster beam, and an ionizer positioned downstream from the beam adjustment device, and configured to ionize the gas cluster beam to produce a GCIB.

According to yet another embodiment, a method of forming a gas cluster ion beam (GCIB) is described, comprising: expanding one or more gases through a nozzle to form a gas cluster beam; passing the gas cluster beam through a gas skimmer; adjusting at least one beam property of the gas cluster beam downstream of the gas skimmer; and following the adjusting, ionizing the gas cluster beam to form the GCIB.

DETAILED DESCRIPTION OF SEVERAL EMBODIMENTS

Figure 1:
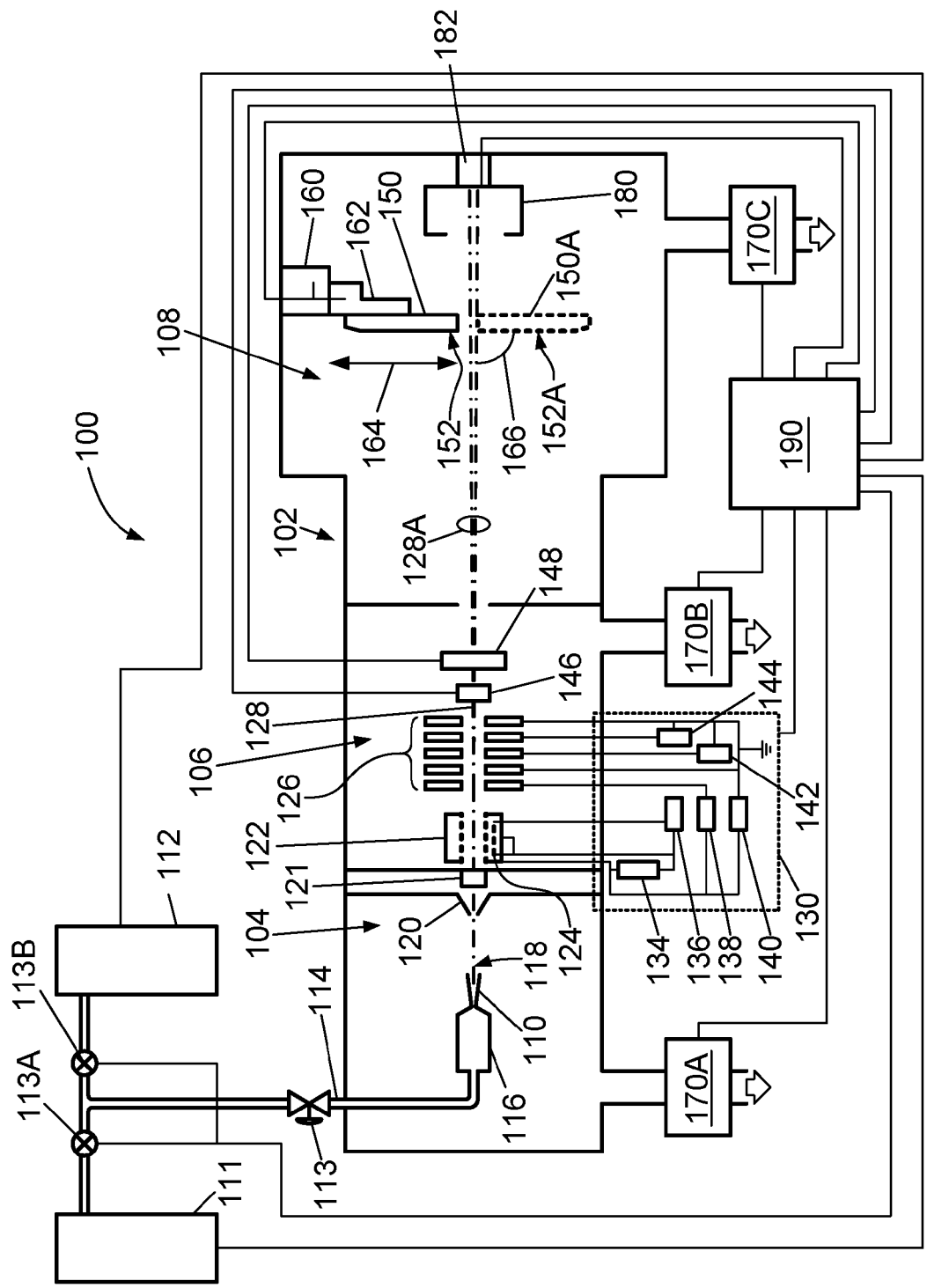
FIG. 1 is an illustration of a GCIB processing system.

A method and device for treating a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

There is a general need for treating a substrate using a GCIB including, but not limited to, smoothing the substrate, etching the substrate, cleaning the substrate, depositing material on the substrate, growing films on the substrate, etc. In a GCIB processing system, a gas cluster beam is produced by expanding one or more gases through a nozzle under high pressure, followed by ionizing the gas cluster beam to produce a GCIB and filtering the GCIB to remove smaller clusters from the GCIB. Furthermore, a skimmer plate, positioned downstream from the nozzle, is often utilized to remove high energy particles from the expanding gas cluster beam.

In order to filter the GCIB, a magnetic field may be imposed upon the passing GCIB, whereby smaller, lighter, faster-moving clusters are deflected more significantly than larger, heavier, slower-moving clusters. The inventors have observed that the use of such a filtering system can be effective in removing singly-charged and multiply-charged monomers and dimers found in the GCIB, while not removing the heavier ionized clusters having thousands of atoms/molecules. Furthermore, the inventors have observed that, at times, a large GCIB or diverging GCIB, as a result of over-focusing, for example, can intercept the interior surfaces of the filtering device (e.g., magnet system) and sputter these surfaces, thereby introducing particles and contamination into the GCIB and subsequent substrate treatment process.

Therefore, a method and device for adjusting a beam property, such as a beam size, a beam shape or a beam divergence angle, in a gas cluster beam prior to ionization of the gas cluster beam is described. A gas cluster ion beam (GCIB) source is provided, comprising a nozzle assembly having a gas source, a stagnation chamber and a nozzle that is configured to introduce under high pressure one or more gases through the nozzle to a vacuum vessel in order to produce a gas cluster beam. Additionally, the GCIB source comprises a gas skimmer positioned downstream from the nozzle assembly that is configured to reduce the number of energetic, smaller particles in the gas cluster beam. Furthermore, the GCIB source comprises a beam adjustment device positioned downstream from the gas skimmer that is configured to adjust at least one beam property of the gas cluster beam, and an ionizer positioned downstream from the beam adjustment device that is configured to ionize the gas cluster beam to produce a GCIB.

According to one embodiment, a GCIB processing system 100 is depicted in FIG. 1 comprising a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam (GCIB) can be formed in the second chamber (ionization/acceleration chamber 106) wherein the gas cluster beam is ionized and optionally accelerated, and then in the third chamber (processing chamber 108) the accelerated or non-accelerated GCIB may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a smoothing gas composition, an etching gas composition, a cleaning gas composition, a film forming gas composition, etc. Further yet, for example, the first gas composition or the second gas composition or both can include a condensable inert gas, carrier gas or dilution gas. For example, the inert gas, carrier gas or dilution gas can include a noble gas, i.e., He, Ne, Ar, Kr, Xe, or Rn, or simple diatomic gases like $N_2$ or $O_2$ can also be used.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas jet emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam 118 entering the ionization/acceleration chamber 106.

As shown in FIG. 1, a beam adjustment device 121 is positioned downstream from the gas skimmer 120 and is configured to perform one or more of sizing gas cluster beam 118, shaping gas cluster beam 118, or collimating the gas cluster beam 118, or a combination of two or more thereof. The beam adjustment device 121 can comprise one or more apertures that are coupled to the vacuum vessel 102, and are disposed in the path of gas cluster beam 118 and aligned with the gas cluster beam 118. The one or more apertures are configured to shape, size and/or collimate the gas cluster beam 118 to adjust at least one beam property prior to ionization.

The one or more apertures can be characterized by a cross-sectional dimension. For example, the cross-sectional dimension may include a diameter or a width. The cross-sectional dimension may be selected to be equal to or greater than the aperture dimension of the gas skimmer 120. However, the cross-sectional dimension may be selected to be less than the aperture dimension of the gas skimmer 120. Additionally, the shape of the one or more apertures can include a circle, an ellipse, a square, a rectangle, a triangle, or a cross-section having any arbitrary shape.

The one or more apertures may include a single aperture that can be used in conjunction with the gas skimmer 120 to collimate the gas cluster beam 118. Alternatively, the one or more apertures may include a plurality of apertures, wherein each aperture is aligned with gas cluster beam 118 and positioned at a different axial location along gas cluster beam 118. Each aperture may have the same size, or shape, or size and shape. The use of two or more apertures can facilitate collimation of the gas cluster beam 118 prior to ionization. The axial distance between multiple apertures can be varied.

Furthermore, the cross-sectional dimension of the one or more apertures can be adjustable. For example, the one or more apertures may include an aperture adjustment device, such as a mechanically adjusting iris or a mechanically variable aperture having a rotatable wheel with multiple apertures of varying shape or size or both.

After the gas cluster beam 118 has been formed and adjusted by the beam adjustment device 121 in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV.

As illustrated in FIG. 1, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
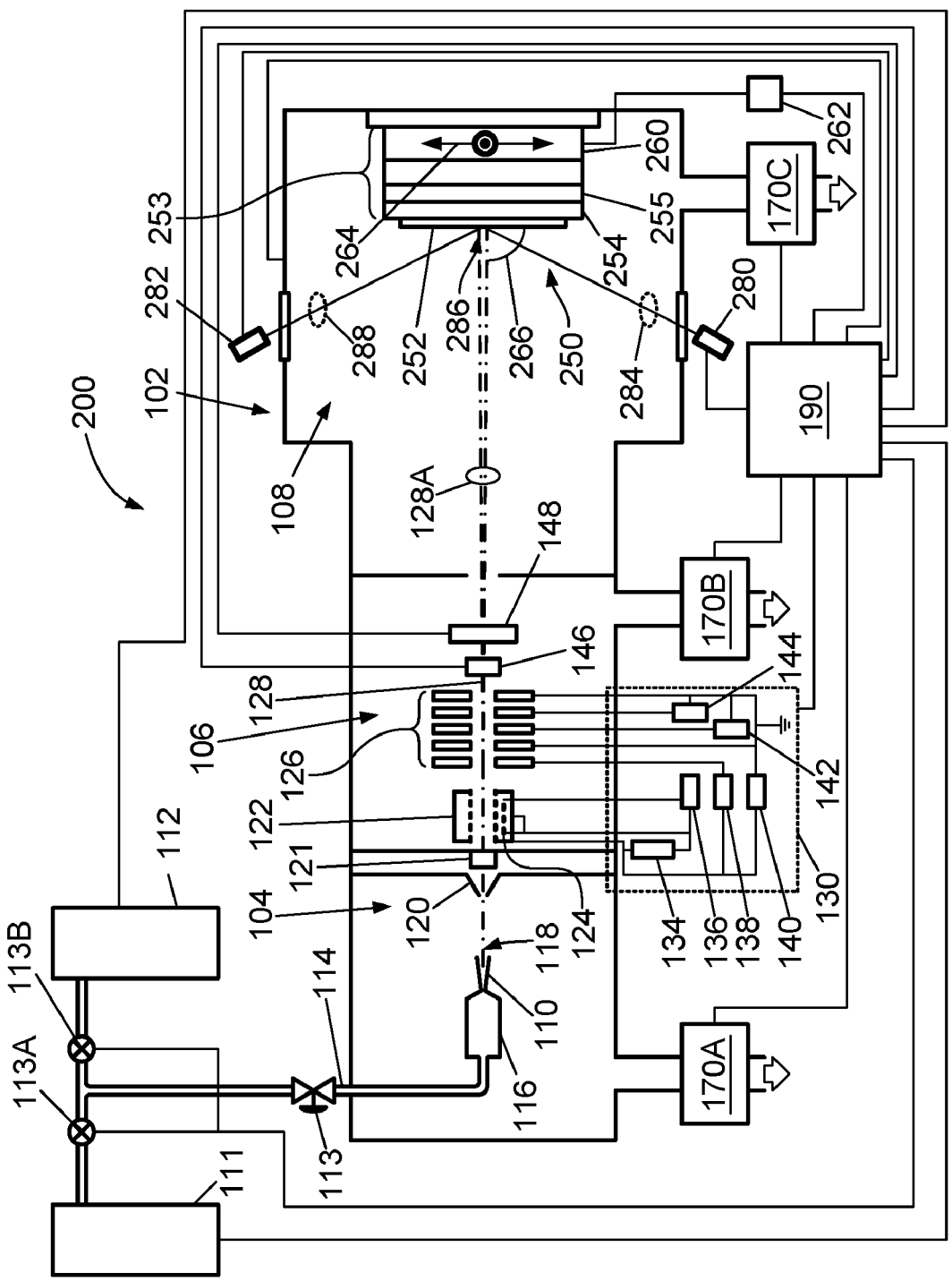
FIG. 2 is another illustration of a GCIB processing system.

In the embodiment shown in FIG. 2, the GCIB processing system 200 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 200 by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 200. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Control system 190 comprises a microprocessor, memory, and a digital I/O port capable of generating control voltages sufficient to communicate and activate inputs to GCIB processing system 100 (or 200) as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam adjustment device 121, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152. One example of control system 190 is a DELL PRECISION WORKSTATION 610™, available from Dell Corporation, Austin, Tex.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 200), or it can be remotely located relative to the GCIB processing system 100 (or 200). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure.

In conventional vacuum processing devices, a 1000 to 3000 liter per second TMP can be employed. TMPs are useful for low pressure processing, typically less than about 50 mTorr. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 3:
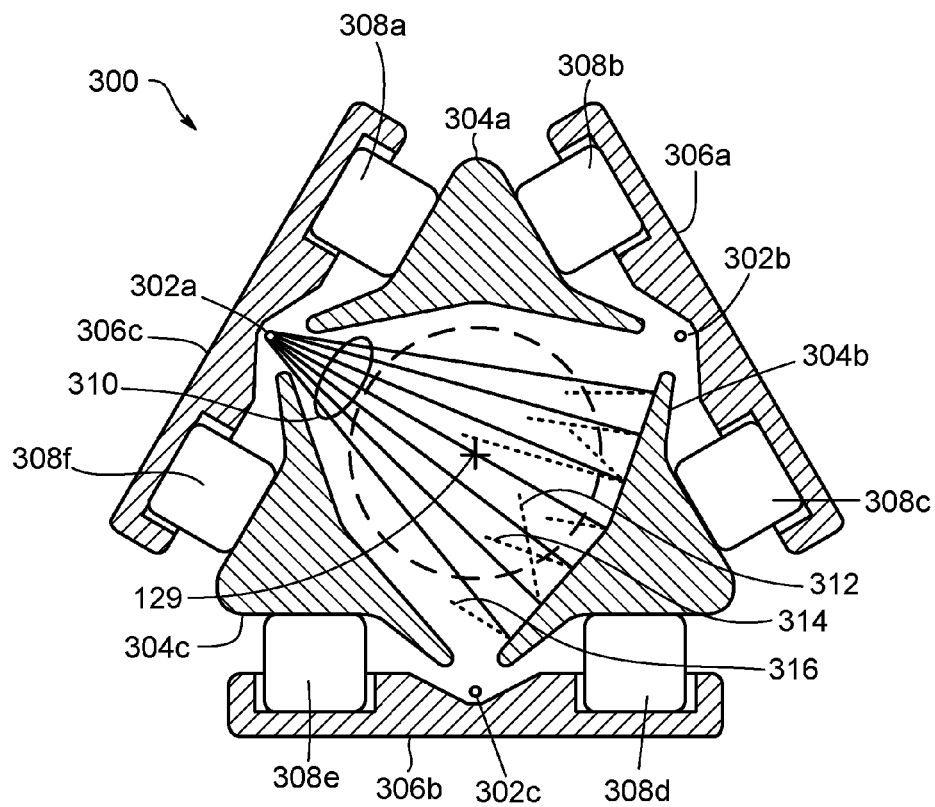
FIG. 3 is an illustration of an ionization source for a GCIB processing system.

Referring now to FIG. 3, a section 300 of a gas cluster ionizer (122, FIGS. 1 and 2) for ionizing a gas cluster jet (gas cluster beam 118, FIGS. 1 and 2) is shown. The section 300 is normal to the axis of GCIB 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from space charge neutrality within the ionizer 122 will result in a rapid dispersion of the jet with a significant loss of beam current. FIG. 3 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from a plasma to ionize clusters. The geometry of these ionizers is quite different from the three filament ionizer described here but the principles of operation and the ionizer control are very similar.

Figure 4:
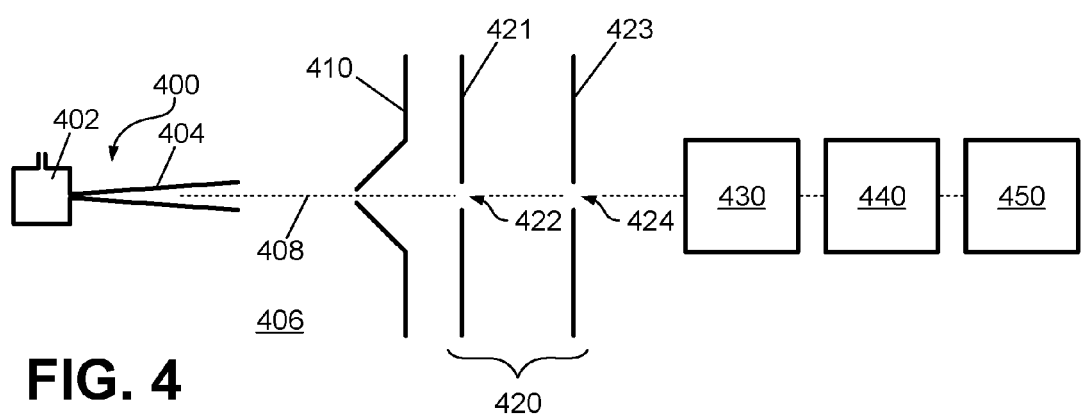
FIG. 4 illustrates a method and device for producing a gas cluster beam and collimating the gas cluster beam according to an embodiment.

As described above, a beam adjustment device, positioned downstream from the gas skimmer, is configured to perform at least one of sizing the gas cluster beam (i.e., adjusting a beam dimension), shaping the gas cluster beam, or collimating the gas cluster beam (i.e., adjusting the beam divergence angle), or a combination of two or more thereof prior to the ionization of the gas cluster beam in the ionizer. Referring now to FIG. 4, a portion of a GCIB processing system, such as the GCIB processing systems (100 and 200) depicted in FIGS. 1 and 2, is illustrated.

A nozzle assembly 400 comprising a gas source (not shown), a stagnation chamber 402 and a nozzle 404 is positioned upstream and configured to introduce one or more gases under high pressure into a vacuum vessel 406. As the one or more gases expand into the vacuum vessel 406, clusters form as described above and a gas cluster beam 408 emanates there from. Downstream from the nozzle assembly 400, the gas cluster beam 408 passes through a gas skimmer 410.

The expanding gas cluster beam 408 passes through an ionizer 430, wherein the gas cluster beam 408 is ionized to form a gas cluster ion beam (GCIB). Further downstream, an electrode assembly 440 is positioned to extract the GCIB from the ionizer 430 and accelerate the GCIB. Thereafter, a beam filter 450, including for example a magnet assembly, may impose a magnetic field across the GCIB in order to filter the GCIB by, for example, eliminating monomers, or monomers and light cluster ions from the GCIB.

However, the inventors have observed that the trajectory of ion clusters approaching the edge of the extraction/acceleration electrodes in electrode assembly 440 may be influenced by aberrations (common to ion optics) that cause distortions in the transmitted ion beam. For example, these ion clusters may be over-focused and pass through a focal point prior to the beam filter 450. As a result, these ion clusters diverge sharply as they enter the beam filter 450, and a portion of the GCIB strikes the interior surface(s) of the magnet assembly, for example, in beam filter 450. The impingement of a portion of the GCIB on the magnet assembly has been observed to cause particle contamination downstream in the processing system.

Therefore, as shown in FIG. 4, a beam adjustment device 420 is positioned downstream from the gas skimmer 410 that is configured to adjust at least one beam property of the gas cluster beam, such as a beam size, a beam shape or a beam divergence angle. The beam adjustment device 420 may comprise one or more aperture plates that eliminate ion clusters traveling near the edge of the gas cluster beam 408, while permitting the more collimated, un-ionized gas clusters having paraxial trajectories to pass.

According to one embodiment, one aperture plate may be utilized to eliminate ion clusters traveling near the edge of the gas cluster beam 408. However, not all of the un-ionized gas clusters travel in laminar (parallel) trajectories. Some gas clusters travel in crossing trajectories. Therefore, according to another embodiment, two aperture plates, separated by an axial distance, may be utilized to eliminate ion clusters traveling near the edge of the gas cluster beam 408 and improve the collimation of the un-ionized gas cluster beam 408, i.e., reduce the number of gas clusters having crossing trajectories, prior to entering ionizer 430.

Referring to FIG. 4, the beam adjustment device 420 may comprise a first aperture plate 421 having a first aperture 422 of a first size, and optionally a second aperture plate 423 having a second aperture 424 of a second size. As shown in FIG. 4, the first aperture plate 421 and optional second aperture plate 423 are positioned along gas cluster beam 408 and aligned with gas cluster beam 408. The first aperture plate 421 and the optional second aperture plate 423 can have the same size, or same shape, or same size and shape.

When two or more aperture plates are utilized, the plurality of aperture plates is spaced in an axial direction. This axial spacing may be variable.

The first size of the first aperture 422 can include a diameter of circular aperture. The diameter of the first aperture 422 can be selected to be greater than or equal to the diameter of the aperture through gas skimmer 410. However, the diameter of the first aperture 422 can be selected to be less than the diameter of the aperture through gas skimmer 410. The diameter can range from approximately 1 mm to approximately 50 mm and, desirably, the diameter can range from approximately 10 mm to approximately 20 mm; e.g., 12.5 mm to 15 mm.

Figure 5:
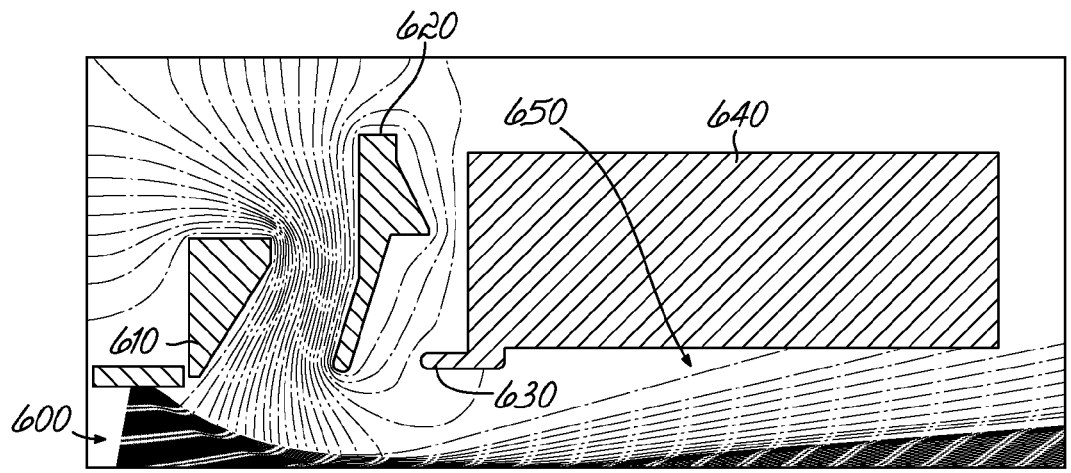
FIG. 5 illustrates a full-width gas cluster ion beam passing through extraction electrode(s) and shows beam interception on the inside of a beam filter disposed downstream from the extraction electrode(s)

The aberrations in the ion beam (as a result of the extraction system) are illustrated in FIG. 5. FIG. 5 shows extraction of a gas cluster ion beam 600 having a nominal diameter of approximately 41 mm with a three electrode extraction set. The ionizer and the first electrode 610 (or extraction electrode) are biased at +30 kV. The second electrode 620 (the suppression electrode) is biased at −12 kV, while the third electrode 630 is connected to a beam filter comprising a magnet assembly 640 at ground potential. The total energy of the accelerated gas clusters will be the energy of the ionizer and first electrode 610, namely 30 keV for singly charged ions. The over focusing of gas clusters near the edge of the gas cluster ion beam in beam filter region 650 is obvious from the figure.

Figure 6:
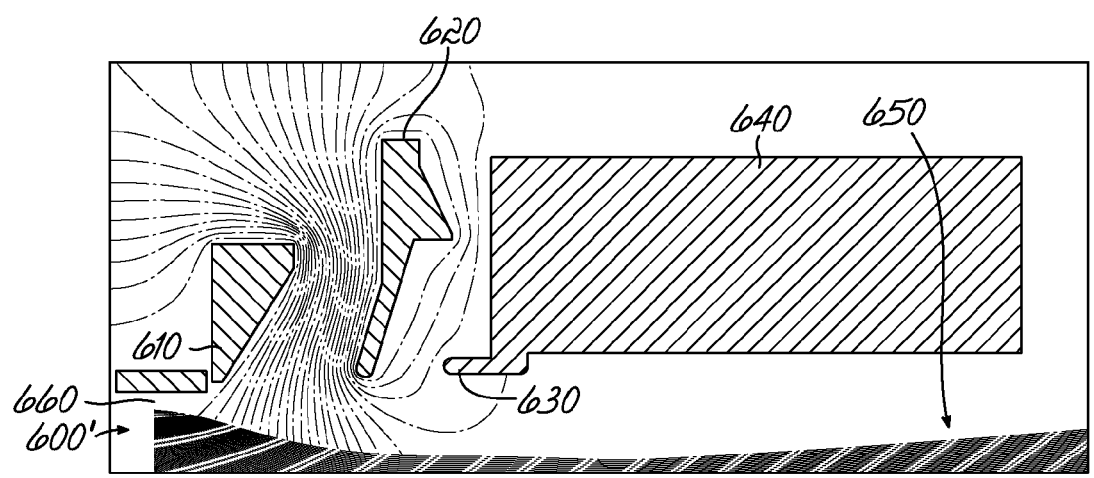
FIG. 6 illustrates a gas cluster ion beam produced with aperturing of the gas cluster jet to produce a gas cluster ion beam which substantially eliminates beam interception on the inside of a beam filter.

FIG. 6 illustrates like features as FIG. 5; however, an upstream aperture 660 (or apertures) has been used to remove from a gas cluster ion beam 600' those gas clusters that would create ions near the edges of the ion extraction system. In this case the gas cluster ion beam 600' is now approximately 30 mm in diameter. Notice that all beam interception on the magnet assembly 640 in beam filter region 650 has been eliminated. The spot size downstream at the processed substrate is also much reduced.

The use of cluster ion beam aperturing removes some clusters from the ionization process, and thus, reduces the beam current available for substrate processing. However, a much more sharply defined beam is available and undesirable beam interception of intervening parts is eliminated, therefore, improving potential beam contamination. The apertures used for shaping the gas cluster ion beam are not eroded and particles are not generated from them because before acceleration the clusters possess too little energy to produce such erosion. Because beam shape and purity is achieved at the expense of beam current, a compromise between substrate purity and substrate throughput is necessary. The optimum operating point will vary depending on the substrates to be processed. For this reason, variable apertures as described above may be desirable.

Alternatively, improvements to the performance of the gas cluster ion beam may be achieved by scaling up the extraction optics. This requires both larger diameter and longer path length beam optics. However, cluster beams are strongly affected by collisions with residual gas within the beam path length. This can be quite detrimental to proper operation of the GCIB processing system and can, in itself, diminish available beam current. In addition, space charge in the ion beam will cause a growth of the beam with further distance and can result in increased interception on beam optics elements and reduced beam current. The methods discussed here allow achieving the necessary performance without impacting beam path length.

Figure 7:
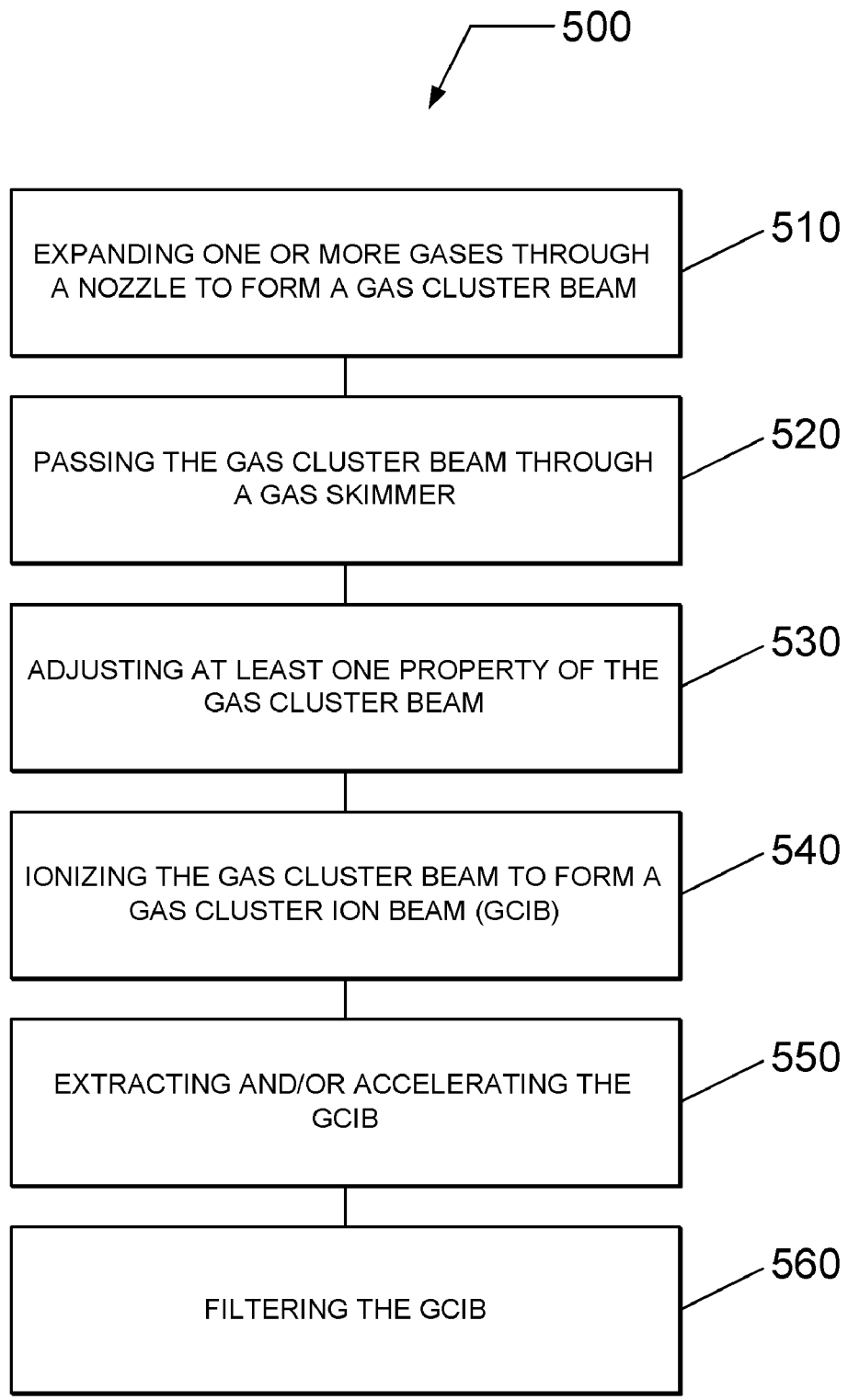
FIG. 7 illustrates a method of treating a substrate using a GCIB according to another embodiment.

Referring now to FIG. 7, a method of treating a substrate using a gas cluster ion beam (GCIB) is described. The method includes a flow chart 500 beginning in 510 with expanding one or more gases through a nozzle to form a gas cluster beam.

In 520, the gas cluster beam is passed through a gas skimmer.

In 530, at least one beam property of the gas cluster beam is adjusted downstream of the gas skimmer. As described above, a beam adjustment device, positioned downstream from the gas skimmer, can be utilized to perform one or more of sizing the gas cluster beam, shaping the gas cluster beam, or collimating the gas cluster beam, or a combination of two or more thereof. The beam adjustment device can comprise one or more apertures that are coupled to the vacuum vessel, and are disposed in the path of gas cluster beam and aligned with the gas cluster beam.

In 540, following the adjusting, the gas cluster beam is ionized to form the GCIB.

Thereafter, in 550, the GCIB is extracted from the ionizer and/or accelerated and, in 560, the GCIB is filtered.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A gas cluster ion beam (GCIB) source, comprising:
a nozzle assembly comprising a gas source, a stagnation chamber and a nozzle, and configured to introduce under high pressure one or more gases through said nozzle to a vacuum vessel in order to produce a gas cluster beam;
a gas skimmer positioned downstream from said nozzle assembly, and configured to reduce the number of energetic, smaller particles in the gas cluster beam;
a beam adjustment device positioned downstream from said gas skimmer, and configured to adjust at least one beam property of said gas cluster beam; and
an ionizer positioned downstream from said beam adjustment device, and configured to ionize the gas cluster beam to produce a GCIB.

2. The GCIB source of claim 1, wherein said beam adjustment device is configured to adjust at least one of a size, a shape, or a divergence angle of said gas cluster beam, or any combination of two or more thereof.

3. The GCIB source of claim 1, wherein said beam adjustment device comprises one or more apertures positioned along the gas cluster beam and aligned with the gas cluster beam.

4. The GCIB source of claim 3, wherein a diameter of said one or more apertures in said beam adjustment device is greater than or equal to a diameter of an aperture in said gas skimmer.

5. The GCIB source of claim 3, wherein a diameter of said one or more apertures in said beam adjustment device is less than or equal to a diameter of an aperture in said gas skimmer.

6. The GCIB source of claim 3, wherein a cross-sectional dimension of said one or more apertures is adjustable.

7. The GCIB source of claim 3, wherein at least one of said one or more apertures comprises a mechanically adjusting iris.

8. The GCIB source of claim 3, wherein at least one of said one or more apertures comprises a mechanically variable aperture having a rotatable wheel with multiple apertures of varying shape.

9. The GCIB source of claim 1, wherein said beam adjustment device comprises a first aperture and a second aperture positioned along the gas cluster beam and aligned with the gas cluster beam, and wherein said first aperture and said second aperture are separated by an axial distance along said GCIB.

10. The GCIB source of claim 9, wherein said axial distance between said first aperture and said second aperture is variable.

11. The GCIB source of claim 1, further comprising:
one or more electrodes positioned downstream from said ionizer, and configured to extract ionized clusters from said ionizer and accelerate said ionized clusters.

12. The GCIB source of claim 11, further comprising:
a filter positioned downstream from said one or more electrodes, and configured to substantially reduce the number of clusters having 100 or less atoms or molecules or both.

13. The GCIB source of claim 12, wherein said filter comprises a magnet assembly configured to impose a magnetic field across said GCIB.

14. The GCIB source of claim 12, further comprising:
a beam gate positioned downstream from said filter, and configured to open and close exposure of said GCIB to a substrate positioned downstream.

15. A GCIB processing system configured to treat a workpiece, said GCIB processing system comprising:
a vacuum vessel;
a gas cluster ion beam (GCIB) source disposed in said vacuum vessel and configured to produce a GCIB, said GCIB source comprising:
   a nozzle assembly comprising a gas source, a stagnation chamber and a nozzle, and configured to introduce under high pressure one or more gases through said nozzle to said vacuum vessel in order to produce a gas cluster beam,
   a gas skimmer positioned downstream from said nozzle assembly, and configured to reduce the number of energetic, smaller particles in said gas cluster beam,
   a beam adjustment device positioned downstream from said gas skimmer, and configured to adjust at least one beam property of said gas cluster beam, and
   an ionizer positioned downstream from said beam adjustment device, and configured to ionize said gas cluster beam to produce said GCIB; and
a workpiece holder configured to support the workpiece inside said vacuum vessel for treatment by said GCIB.

16. The GCIB processing system of claim 15, wherein said beam adjustment device is configured to adjust at least one of a size, a shape, or a divergence angle of said gas cluster beam, or any combination of two or more thereof.

17. The GCIB processing system of claim 15, wherein said beam adjustment device comprises one or more apertures positioned along said gas cluster beam and aligned with said gas cluster beam.

18. A method of forming a gas cluster ion beam (GCIB), comprising:
expanding one or more gases through a stagnation chamber and a nozzle to form a gas cluster beam;
passing said gas cluster beam through a gas skimmer;
adjusting at least one beam property of said gas cluster beam downstream of said gas skimmer; and
following said adjusting, ionizing said gas cluster beam to form said GCIB.

19. The method of claim 18, wherein said adjusting at least one beam property comprises adjusting a beam dimension, a beam shape, or a beam divergence angle, or a combination of two or more thereof.

20. The method of claim 18, further comprising:
extracting and accelerating said GCIB; and
filtering said GCIB to substantially reduce the number of clusters having 100 or less atoms or molecules or both.

* * * * *